United States Patent
Onishi

(10) Patent No.: US 8,344,796 B2
(45) Date of Patent: Jan. 1, 2013

(54) SWITCHED CAPACITOR CIRCUIT

(75) Inventor: Akinobu Onishi, Ota (JP)

(73) Assignee: ON Semiconductor Trading, Ltd., Hamilton (BM)

( * ) Notice: Subject to any disclaimer, the term of this patent is extended or adjusted under 35 U.S.C. 154(b) by 0 days.

(21) Appl. No.: 13/193,097

(22) Filed: Jul. 28, 2011

(65) Prior Publication Data

US 2012/0025893 A1 Feb. 2, 2012

(30) Foreign Application Priority Data

Jul. 30, 2010 (JP) ................... 2010-171665

(51) Int. Cl.
*H03K 5/08* (2006.01)
*H03K 5/00* (2006.01)
(52) U.S. Cl. ........................ 327/554; 327/309
(58) Field of Classification Search .......... 327/336–337, 327/554
See application file for complete search history.

(56) References Cited

U.S. PATENT DOCUMENTS

| 4,677,322 | A * | 6/1987 | Burson et al. ................... 327/42 |
| 6,614,285 | B2 * | 9/2003 | Lee et al. ...................... 327/337 |
| 6,653,886 | B1 | 11/2003 | Lee et al. |
| 6,839,015 | B1 | 1/2005 | Sutardja et al. |
| 7,522,086 | B2 * | 4/2009 | Lee ............................... 341/172 |
| 2001/0045817 | A1 | 11/2001 | Cusinato et al. |

OTHER PUBLICATIONS

Extended European Search Report for Application 11175061.8 dated Nov. 23, 2011 (5 pages).

* cited by examiner

*Primary Examiner* — Dinh T. Le
(74) *Attorney, Agent, or Firm* — Osha Liang LLP

(57) ABSTRACT

A switched capacitor circuit includes a capacitor and switches located on an input side and an output side of the capacitor. The switched capacitor circuit also includes an operational amplifier of a later stage which receives an output of the capacitor, wherein a current value of a current supplied to the operational amplifier is switched according to at least one open/closed state of at least one of the switches.

2 Claims, 16 Drawing Sheets

SWITCHED CAPACITOR CIRCUIT

CROSS-REFERENCE TO RELATED APPLICATIONS

The present application claims priority from Japanese Patent Application No. 2010-171665, filed on Jul. 30, 2010. The entire disclosure of Japanese Patent Application No. 2010-171665, filed on Jul. 30, 2010, including specification, claims, drawings, and abstract, is incorporated herein by reference in its entirety.

BACKGROUND OF INVENTION

1. Technical Field

One or more embodiments of the present invention relate to a switched capacitor circuit with reduced power consumption.

2. Background Art

A switched capacitor circuit is used in many cases as a circuit element of a discrete system, and is applied to a filter, a comparator, an analog-to-digital converter, a digital-to-analog converter, or the like. In addition, the switched capacitor circuit is primarily formed in combination with an operational amplifier.

FIG. 25 is a diagram showing a structure of a positive phase integrating circuit 100 to which a switched capacitor circuit 102 is applied. As shown in FIG. 2, the switched capacitor circuit 102 is operated in a switching manner between a sampling mode in which a clock signal $\phi 1$ is set to a high level and a clock signal $\phi 2$ is set to a low level such that switches SW1 and SW3 are set to the ON state and switches SW2 and SW4 are set to the OFF state, and charges corresponding to an input voltage VIN are held in a capacitor C1, and an integration mode in which the clock signal $\phi 1$ is set to the low level and the clock signal $\phi 2$ is set to the high level such that the switches SW1 and SW3 are set to the OFF state and the switches SW2 and SW4 are set to the ON state, and the charges sampled in the capacitor C1 are supplied to a capacitor C2 and integrated.

Here, power consumption of the operational amplifier in the system to which the switched capacitor circuit is applied accounts for a large portion of the power consumption of the overall system such as the analog-to-digital converter and the digital-to-analog converter. Because of this, reduction of the power consumption of the operational amplifier is very effective in reducing the power consumption of the overall system.

However, the reduction in the power consumption and the performance of the circuit are in a tradeoff relationship, and a simple reduction of the current flowing in the operational amplifier may cause degradation of the performance of the system.

SUMMARY OF INVENTION

According to one or more embodiments of the present invention, there is provided a switched capacitor circuit comprising a capacitor, switching elements provided on an input side and an output side of the capacitor, respectively, an element which receives an output of the capacitor, and a current controlling circuit which switches a current value of a current supplied to the element according to at least one open/close state of the switching elements.

BRIEF DESCRIPTION OF THE DRAWINGS

One or more embodiments of the present invention will be described in further detail based on the following drawings, wherein.

DETAILED DESCRIPTION

In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention.

<Positive Phase Integrating Circuit>

Figure 1:
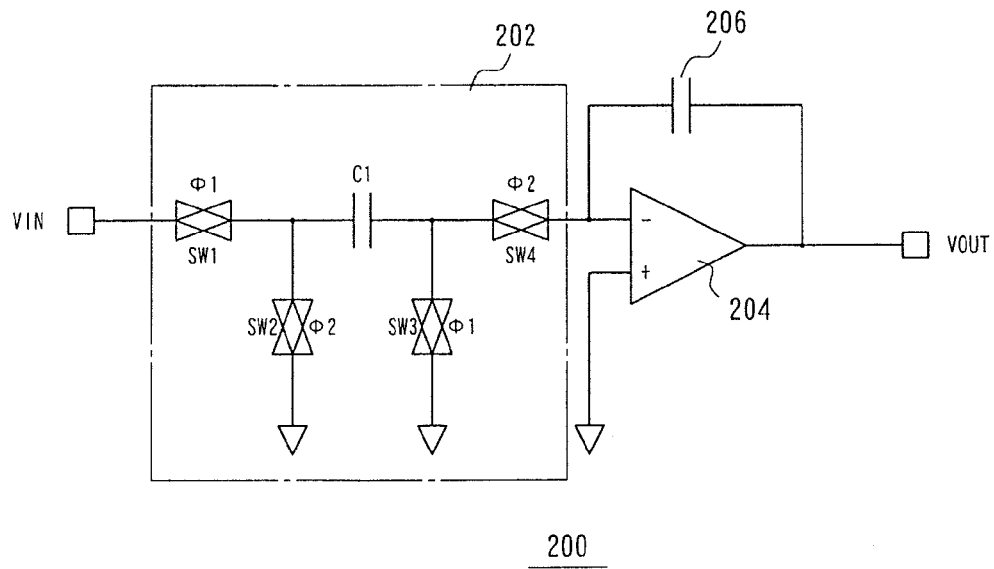
FIG. 1 is a diagram showing a structure of a positive phase integrating circuit according to one or more embodiments of the present invention.

As shown in FIG. 1, a positive phase integrating circuit 200 of one or more embodiments of the present invention comprises a switched capacitor circuit 202, an operational amplifier 204, and a capacitor 206.

The switched capacitor circuit 202 comprises switches SW1~SW4 and a capacitor C1. The switch SW1 opens and closes a connection between an input terminal of an input voltage VIN and a first terminal of the capacitor C1 in accordance with a clock signal φ1. The switch SW2 opens and closes a connection between the first terminal of the capacitor C1 and ground in accordance with a clock signal φ2. The switch SW3 opens and closes a connection between a second terminal of the capacitor C1 and ground in accordance with the clock signal φ1. The switch SW4 opens and closes a connection between an inverting input terminal (−) of the operational amplifier and the second terminal of the capacitor C1 in accordance with the clock signal φ2.

The operational amplifier 204 and the capacitor 206 form an integrating circuit. Specifically, a non-inverting input terminal (+) of the operational amplifier 204 is grounded and the inverting input terminal (−) and an output terminal of the operational amplifier 204 are connected via the capacitor 206. With this structure, a signal which is input from the switched capacitor circuit 202 to the inverting input terminal (−) is integrated, and the integrated value is output as an output voltage VOUT from the output terminal.

Figure 2:
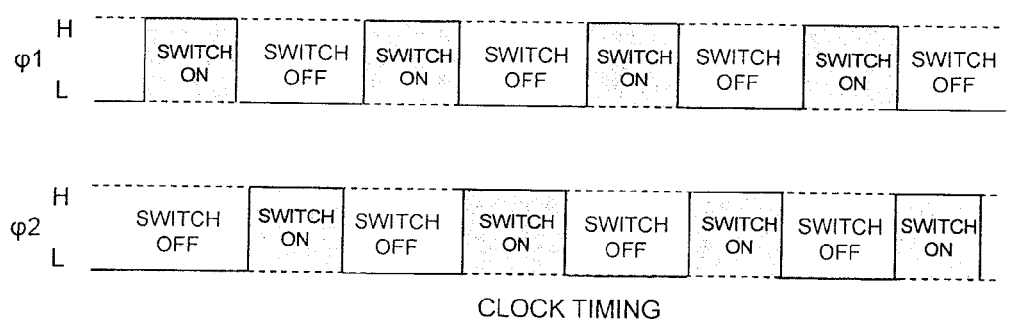
FIG. 2 is a diagram showing a timing chart of clocks according to one or more embodiments of the present invention.
Figure 3:
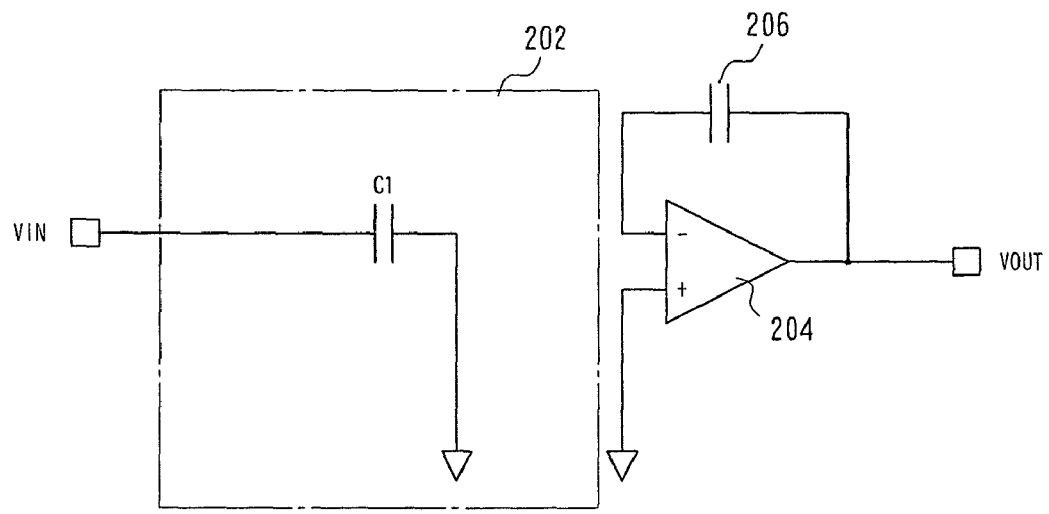
FIG. 3 is a diagram showing an operation of a positive phase integrating circuit according to one or more embodiments of the present invention.

The positive phase integrating circuit 200 has a structure to be controlled between a sampling mode and an integration mode by the four switches (SW1~SW4). As shown in a clock timing chart of FIG. 2, φ1 and φ2 are two-phase clocks which do not overlap each other. In the sampling mode, the clock φ1 is set to the high level, to switch SW1 and SW3 ON, and the clock φ2 is set to the low level, to switch SW2 and SW4 OFF. In this configuration, the positive phase integrating circuit 200 is in a sampling state in which the input voltage VIN is sampled by the capacitor C1, as shown in FIG. 3.

Figure 4:
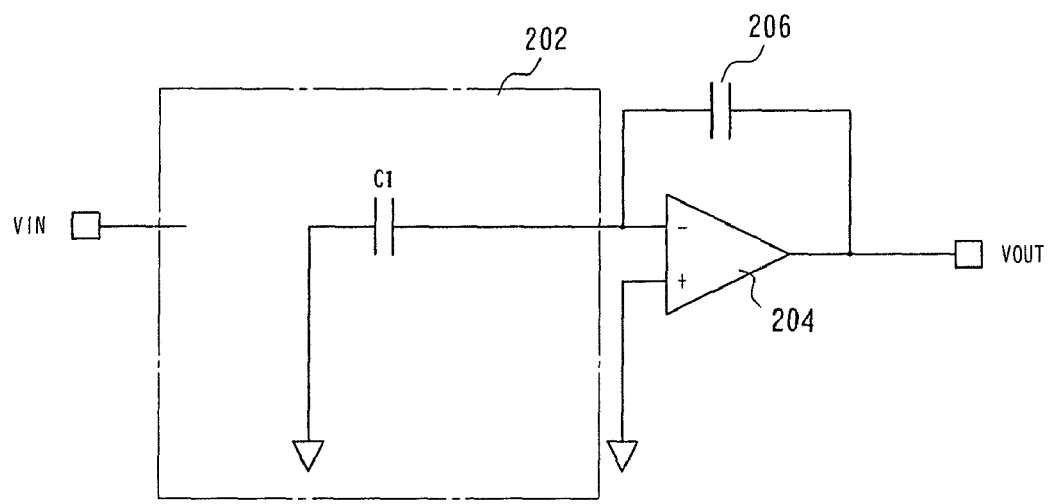
FIG. 4 is a diagram showing an operation of a positive phase integrating circuit according to one or more embodiments of the present invention.

Then, the clock φ1 is set to the low level, to switch SW1 and SW3 OFF and the clock φ2 is set to the high level, to switch SW2 and SW4 ON. In this configuration, the positive phase integrating circuit 200 is in the integration mode in which the voltage sampled in the capacitor C1 is integrated, as shown in FIG. 4.

With regard to a transmission characteristic of the positive phase integrating circuit 200, if the input voltages and the output voltages at time t=nT (where n=1, 2, 3, . . . and T=clock period) are VIN(nT) and VOUT(nT), respectively, the following difference equation of Equation (1) holds because of charge conservation:

Equation 1

$$-C2*VOUT(nT) = -C2*VOUT((n-1)T) - C1*VIN((n-1)T) \quad (1)$$

Here, if the Z-transforms of VIN(nT) and VOUT(nT) are VIN(Z) and VOUT(Z), respectively, the above-described Z-transform can be represented by the following Equation (2):

Equation 2

$$-C2*VOUT(Z) = -C2*Z^{-1}*VOUT(Z) - C1*Z^{-1}*VIN(Z) \quad (2)$$

Here, $*Z^{-1}$ represents a delay operator.

The above-described equations can be simplified, so that a transmission function H(Z) can be represented by the following Equation (3):

Equation 3

$$H(Z) = VOUT(Z)/VIN(Z) = (C1/C2)*Z^{-1}/(1-Z^{-1}) \quad (3)$$

In the integration mode, a large amount of current is required because the integration operation must be completed within half periods of the clocks φ1 and φ2 (that is, the capacitance of the capacitor 206 must be charged or discharged). On the other hand, in the sampling mode, the current necessary for the operational amplifier 204 may be relatively small compared to the integration mode because it is only required to hold the output voltage VOUT of the operational amplifier 204.

In the operational amplifier of the related art, the current is not changed in the sampling mode and the integration mode due to requirement of the current for maintaining the performance (here, the current necessary in the integration mode). In other words, although the operational amplifier operates in a state with a lower current in the sampling mode, the current setting is identical to that in the integration mode, and thus the current is excessive in the sampling mode.

In the positive phase integrating circuit 200, because the sampling and integration are repeated at the operation timings of the clocks φ1 and φ2, it is possible to change the current flowing in the operational amplifier 204 accordingly. Thus, in the positive phase integrating circuit 200, the current flowing in the operational amplifier 204 is switched between the high and low periods of the clocks φ1 and φ2. In other words, in the sampling mode, the supply current to the operational amplifier 204 is set to a lower value, and in the integration mode, the supply current to the operational amplifier 204 is returned to the normal value. With this process, the power consumption of the overall circuit can be reduced without degrading the performance of the circuit.

<Negative Phase Integrating Circuit>

Figure 5:
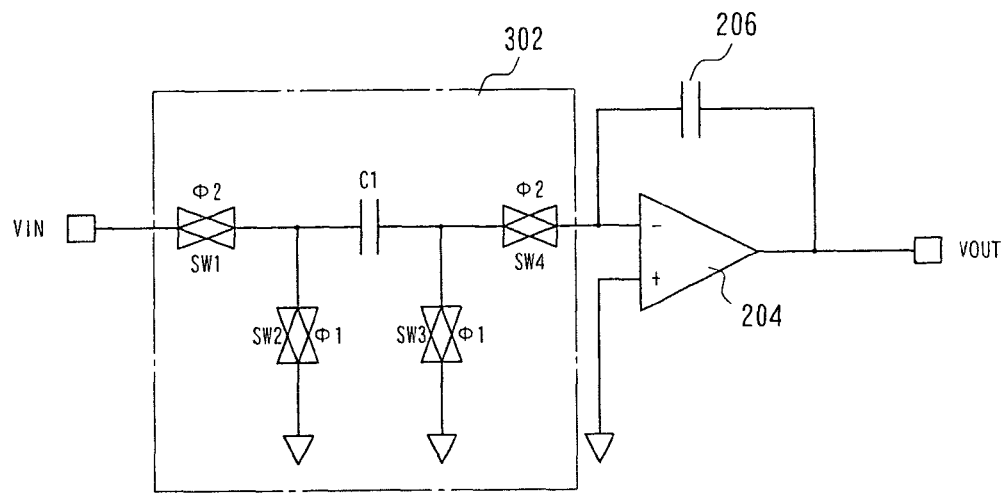
FIG. 5 is a diagram showing a structure of a negative phase integrating circuit according to one or more embodiments of the present invention.

As shown in FIG. 5, a negative phase integrating circuit 300 of one or more embodiments of the present invention comprises a switched capacitor circuit 302, an operational amplifier 204, and a capacitor 206.

The switched capacitor circuit 302 has a structure similar to the switched capacitor circuit 202 of the positive phase integrating circuit 200 except that the clocks φ1 and φ2 applied to switches SW1 and SW2 in the switched capacitor circuit 302 differ from those of the positive phase integrating circuit 200.

The switched capacitor circuit 302 comprises switches SW1~SW4 and a capacitor c1. The switch SW1 opens and closes a connection between an input terminal of an input voltage VIN and a first terminal of the capacitor C1 according to the clock signal φ2. The switch SW2 opens and closes a connection between the first terminal of the capacitor C1 and ground in accordance with the clock signal φ1. The switch SW3 opens and closes a connection between a second terminal of the capacitor C1 and ground in accordance with the clock signal φ1. The switch SW4 opens and closes a connection between an inverting input terminal (−) of the operational amplifier and the second terminal of the capacitor C1 in accordance with the clock signal φ2.

Figure 6:
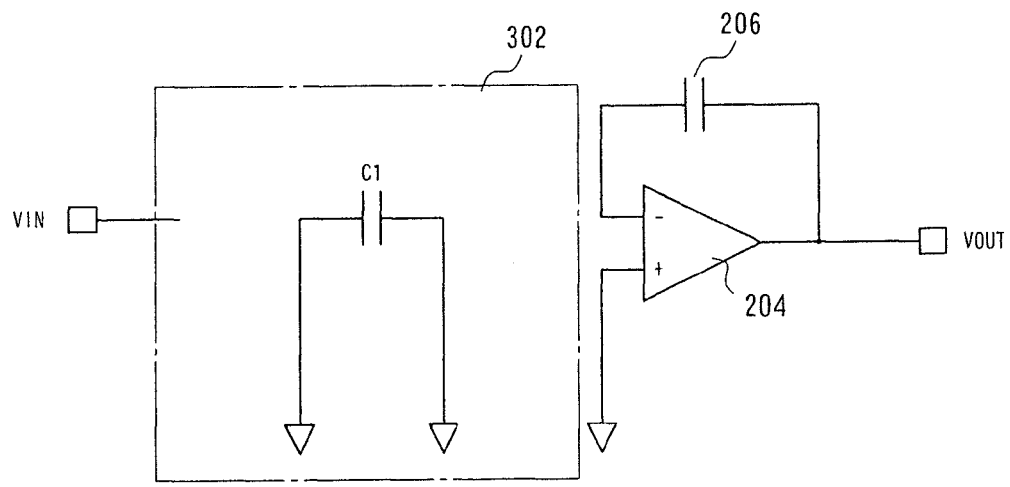
FIG. 6 is a diagram showing an operation of a negative phase integrated circuit according to one or more embodiments of the present invention.

The negative phase integrating circuit 300 has a structure to be controlled between a sampling mode and an integration mode by the four switches (SW1~SW4). As shown in the clock timing chart of FIG. 2, φ1 and φ2 are two-phase clocks which do not overlap each other. In the sampling mode, the clock φ1 is set to the high level, to switch SW2 and SW3 ON and the clock φ2 is set to the low level, to switch SW1 and SW4 OFF. In this configuration, the integrating circuit 300 is in a sampling state in which the charged voltage of the capacitor C1 is maintained, as shown in FIG. 6.

Figure 7:
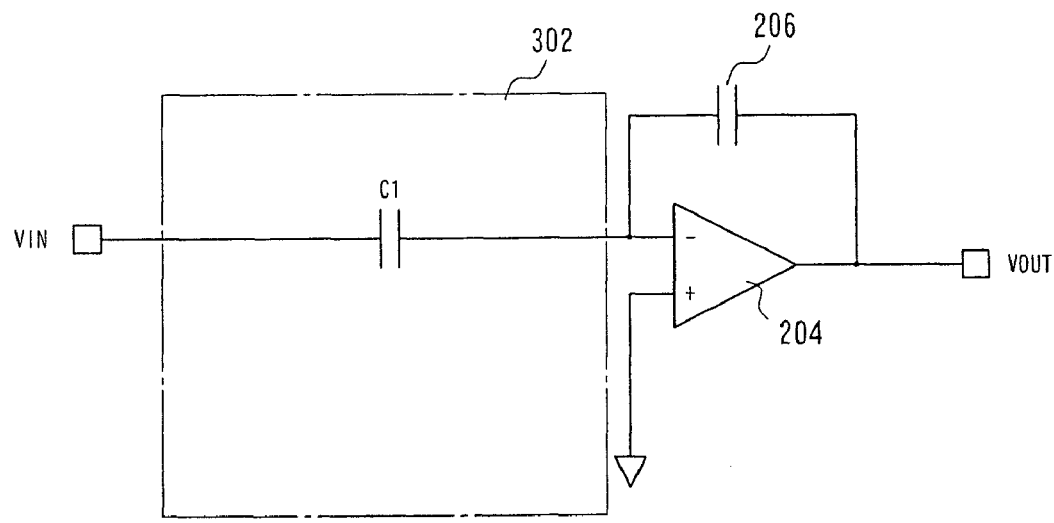
FIG. 7 is a diagram showing an operation of a negative phase integrating circuit according to one or more embodiments of the present invention.

Then, the clock φ1 is set to the low level, to switch SW2 and SW3 OFF, and the clock φ2 is set to the high level, to switch SW1 and SW4 ON. In this configuration, the integrating circuit 300 is in the integration state in which a voltage obtained by sampling the input voltage VIN through the capacitor C1 is supplied to the operational amplifier, as shown in FIG. 7.

With regard to the transmission characteristic of the integrating circuit 300, when the input voltages and output voltages at time t=nT (where n=1, 2, 3, ... and T=clock period) are VIN(nT) and VOUT(nT), respectively, a difference equation of Equation (4) holds because of charge conservation:

Equation 4

$$-C2*VOUT(nT)-C1*VIN(nT)=-C2*VOUT((n-1)T) \quad (4)$$

If the Z-transforms of VIN(nT) and VOUT(nT) are VIN(Z) and VOUT(Z), respectively, the above-described Z-transform can be represented by the following Equation (5):

Equation (5)

$$-C2*VOUT(Z)-C1*VIN(Z)=-C2*Z^{-1}*VOUT(Z) \quad (5)$$

Here, $*Z^{-1}$ represents a delay operator.

The above-described equations can be simplified, so that a transmission function H(Z) is represented by the following Equation (6):

Equation (6)

$$H(Z)=VOUT(Z)/VIN(Z)=-(C1/C2)*1/(1-Z^{-1}) \quad (6)$$

In the negative phase integrating circuit 300, because sampling and integration are repeated at the operation timings of the clocks φ1 and φ2, it is possible to change the current flowing in the operational amplifier 204 accordingly. In the integrating circuit 300, the current is switched between the high and low periods of the clocks φ1 and φ2. In other words, in the sampling mode, the supply current to the operational amplifier 204 is set to a lower value, and in the integration mode, the supply current to the operational amplifier 204 is returned to the normal value. With this configuration, the power consumption of the overall circuit can be reduced without degrading the performance of the circuit.

<Non-Inverting Amplifier>

Figure 8:
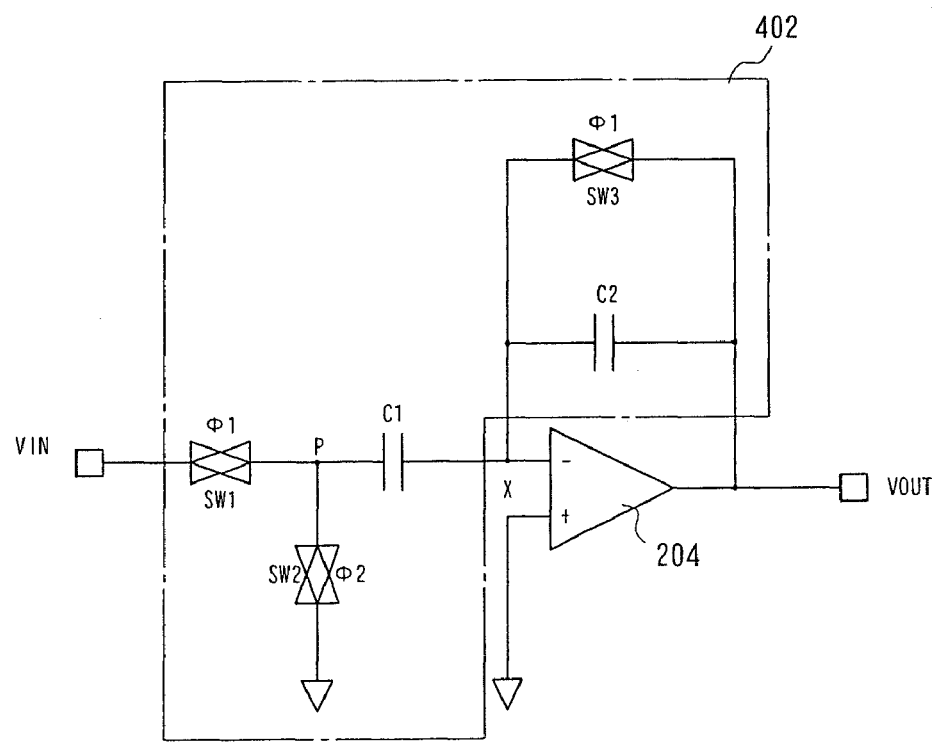
FIG. 8 is a diagram showing a structure of a non-inverting amplifier according to one or more embodiments of the present invention.

As shown in FIG. 8, a non-inverting amplifier 400 of one or more embodiments of the present invention comprises a switched capacitor circuit 402 and an operational amplifier 204.

The switched capacitor circuit 402 comprises switches SW1~SW3 and capacitors C1 and C2. The switch SW1 opens and closes a path between an input terminal of an input voltage VIN and a first terminal of the capacitor C1 according to the clock signal φ1. The switch SW2 opens and closes a supply path of an operation common voltage VC to the first terminal of the capacitor C1 according to the clock signal φ2. The switch SW3 opens and closes a connection between both terminals of the capacitor C2 according to the clock signal φ1.

A second terminal of the capacitor C1 is connected to a non-inverting input terminal (−) of the operational amplifier 204. In addition, the first terminal of the capacitor C2 is connected to the non-inverting input terminal (−) of the operational amplifier 204, and the second terminal of the capacitor C2 is connected to an output terminal of the operational amplifier. The operation common voltage VC is supplied to the non-inverting input terminal (+) of the operational amplifier 204.

Figure 9:
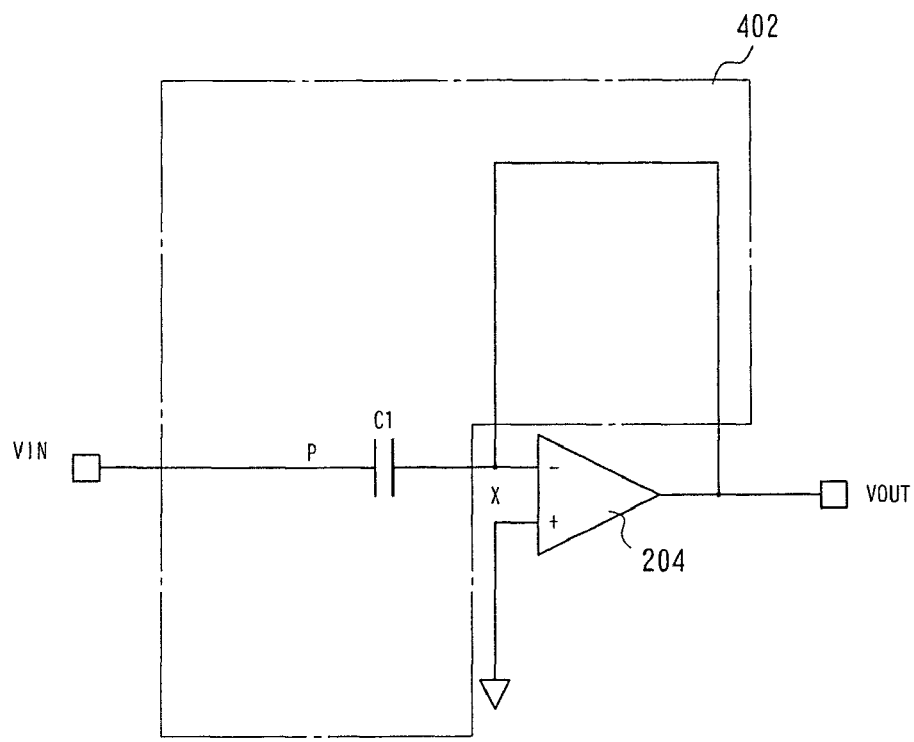
FIG. 9 is a diagram showing an operation of a non-inverting amplifier according to one or more embodiments of the present invention.

The non-inverting amplifier 400 has a structure to be controlled between a sampling mode and an amplification mode by the three switches (SW1~SW3). As shown in the clock timing chart of FIG. 2, φ1 and φ2 are two-phase clocks which do not overlap each other. In the sampling mode, the clock φ1 is set to the high level, to switch SW1 and SW3 ON, and the clock φ2 is set to the low level, to switch SW2 OFF. In this configuration, in this mode, as shown in FIG. 9, the output voltage VOUT of the non-inverting amplifier 400 is VOUT=VX≈operation common voltage VC (voltage at a point X), and the voltage between both terminals of the capacitor C1 is input voltage VIN−common voltage VC. Thus, the output follows the input voltage VIN.

Figure 10:
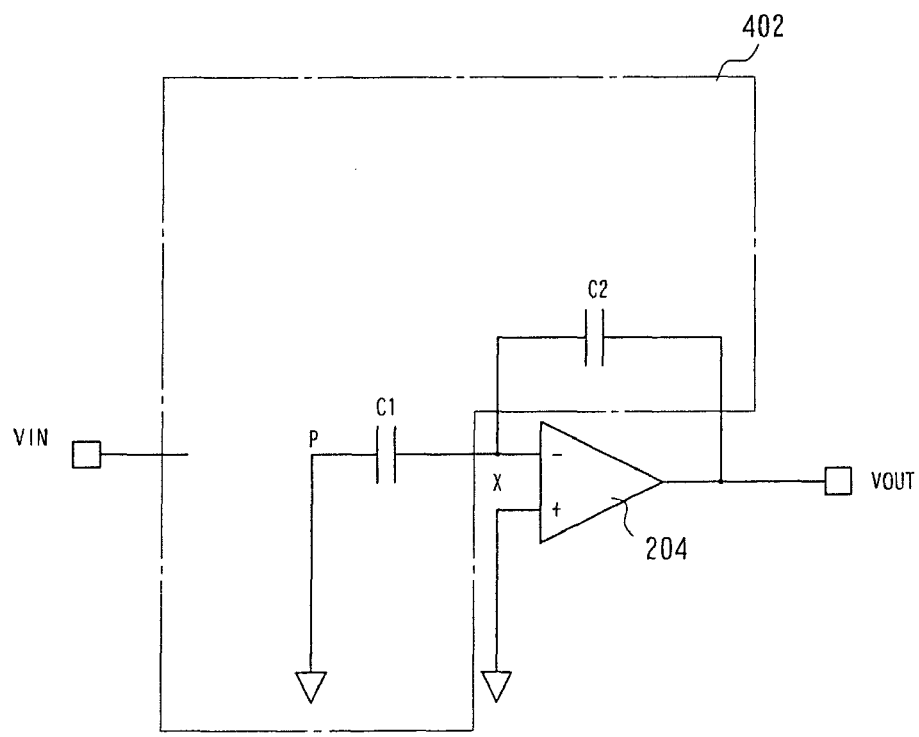
FIG. 10 is a diagram showing an operation of a non-inverting amplifier according to one or more embodiments of the present invention.

Then, the clock φ1 is set to the low level, to switch SW1 and SW3 OFF, and the clock φ2 is set to the high level, to switch SW2 ON. In this process, the non-inverting amplifier 400 is set in an amplification mode in which a voltage sampled in the capacitor C1 is amplified, as shown in FIG. 10.

In this case, a voltage Vp (=voltage at a point P) of the first terminal of the capacitor C1 is changed from the voltage VIN0+operation common voltage VC (VIN0: a final voltage between terminals of the capacitor C1 in the sampling mode) to the operation common voltage VC. Because of the high gain of the operational amplifier 204, the node of the second terminal X of the capacitor C1 is set as a virtual ground, and the charges are maintained in the capacitor C1. Because of this, charging takes place by the operational amplifier such that the output voltage VOUT is set equal to a voltage obtained by multiplying the voltage VIN0 between terminals of the capacitor C1 by the voltage gain C1/C2, and the output voltage VOUT is set to VOUT=(C1/C2)×VIN0+VC. This voltage is maintained, and the process at the next stage is enabled.

With these operations, the final voltage of the circuit may be amplified by an arbitrary gain within the operation range of the operational amplifier 204 with the same polarity as the voltage VIN0. In addition, the clock timings may be controlled such that when the mode transitions from the sampling mode to the amplification mode, the switch SW3 is switched OFF slightly earlier than the switch SW1, so that the influence of charge injection by the switch can be significantly reduced.

Because a voltage corresponding to the input voltage and the voltage gain (C1/C2) of the circuit must be output (the capacitance of the capacitor C2 must be charged) within the half periods of the clocks in the amplification mode, a large amount of current is required. On the other hand, in the sampling mode, it is only required to short-circuit the inverting input terminal (−) and the output terminal of the operational amplifier 204 and maintain the operation common voltage VC, and thus the current required for the operational amplifier 204 is relatively small compared to the amplification mode.

Therefore, in the non-inverting amplifier 400 of one or more embodiments of the present invention, the repetition of the sampling and amplification according to the operation timings of clocks φ1 and φ2, the current flowing in the operational amplifier 204 may be changed accordingly. In one or more embodiments of the present invention, because the current between the high/low periods of the clocks φ1 and φ2 is switched (that is, the current is set to a lower value in the sampling mode and the current is set to a normal current in the amplification mode), the power consumption of the overall circuit can be reduced without degrading the circuit performance.

<Sample and Hold Circuit>

Figure 11:
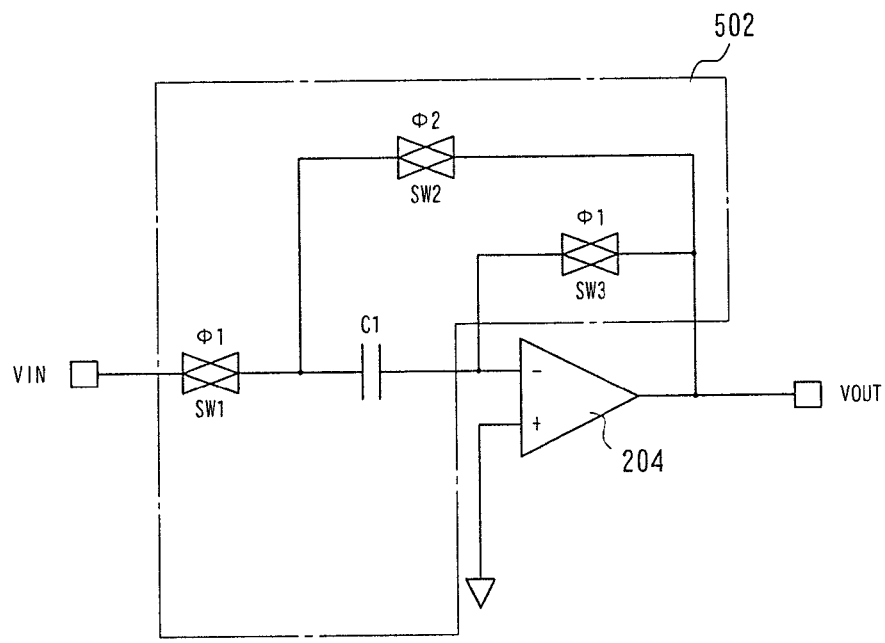
FIG. 11 is a diagram showing a structure of a sample and hold circuit according to one or more embodiments of the present invention.

As shown in FIG. 11, a sample and hold circuit 500 of one or more embodiments of the present invention comprises a switched capacitor circuit 502 and an operational amplifier 204.

The switched capacitor circuit 502 comprises switches SW1~SW3 and a capacitor C1. The switch SW1 opens and closes a path between an input terminal of an input voltage VIN and a first terminal of the capacitor C1 according to the clock signal φ1. The switch SW2 opens and closes a path between the first terminal of the capacitor C1 and an output terminal of the operational amplifier 204 according to the clock signal φ2. The switch SW3 opens and closes a path between a second terminal of the capacitor C1 and the output terminal of the amplifier 204 according to the clock signal φ1.

The second terminal of the capacitor C1 is connected to an inverting input terminal (−) of the operational amplifier 204. A non-inverting input terminal (+) of the operational amplifier 204 is grounded.

Figure 12:
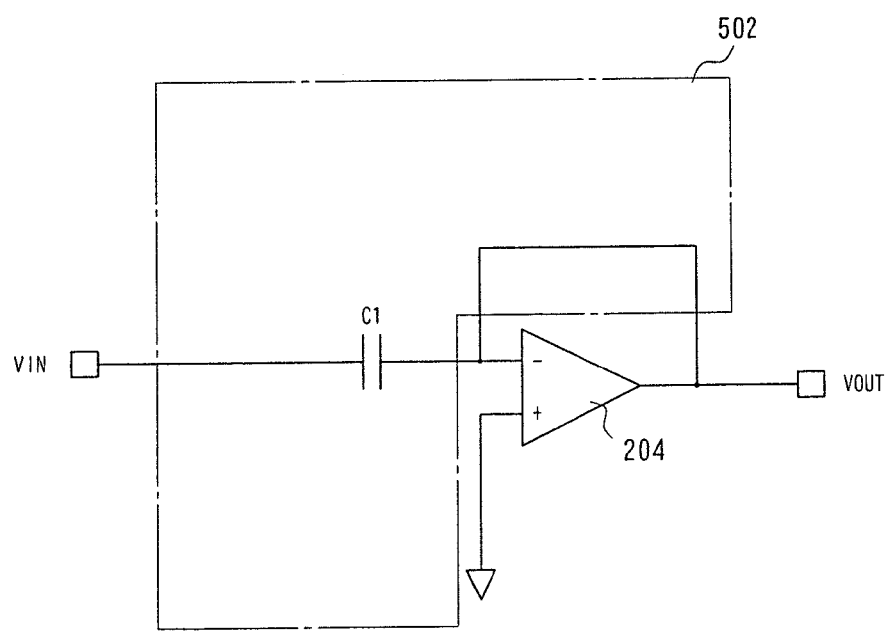
FIG. 12 is a diagram showing an operation of a sample and hold circuit according to one or more embodiments of the present invention.
Figure 13:
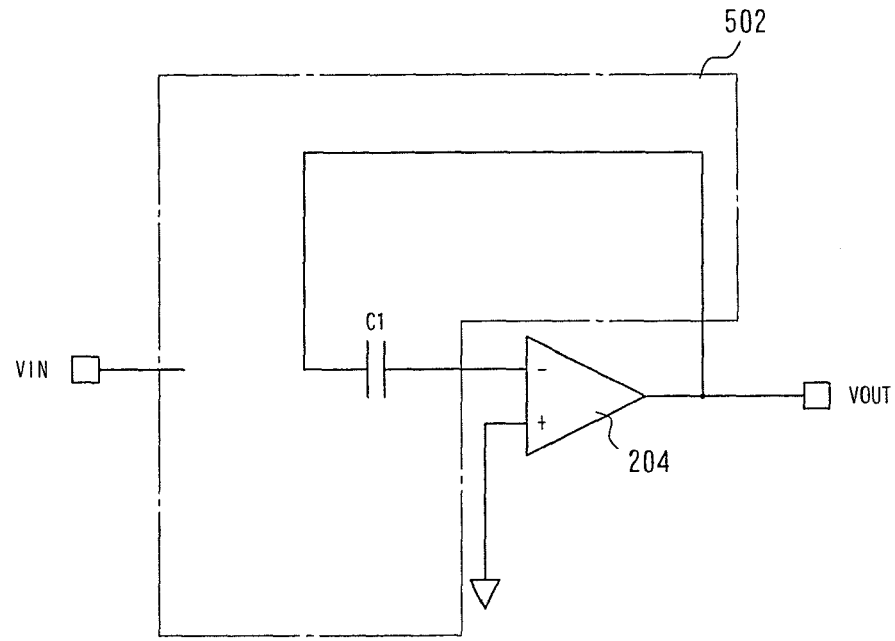
FIG. 13 is a diagram showing an operation of a sample and hold circuit according to one or more embodiments of the present invention.

In a sampling mode, the clock φ1 is set to the high level, to switch SW1 and SW3 ON and the clock φ2 is set to the low level, to switch SW2 OFF. With this process, the sample and hold circuit 500 is set in a sampling mode as shown in FIG. 12. Then, the clock φ1 is set to the low level, to switch SW1 and SW3 OFF, and the clock φ2 is set to the high level, to switch SW2 ON. With this process, the sample and hold circuit 500 is set in a holding mode, as shown in FIG. 13.

In the sample and hold circuit 500 of one or more embodiments of the present invention, the repetition of sampling and holding according to the operation timings of the clocks φ1 and φ2, the current flowing in the operational amplifier 204 is changed accordingly. In one or more embodiments of the present invention, the current is set to a lower value in the sampling mode and to a normal current value in the holding mode. Therefore, the power consumption of the overall circuit can be reduced without degrading the circuit performance.

<Unity Gain Sampling Circuit>

Figure 14:
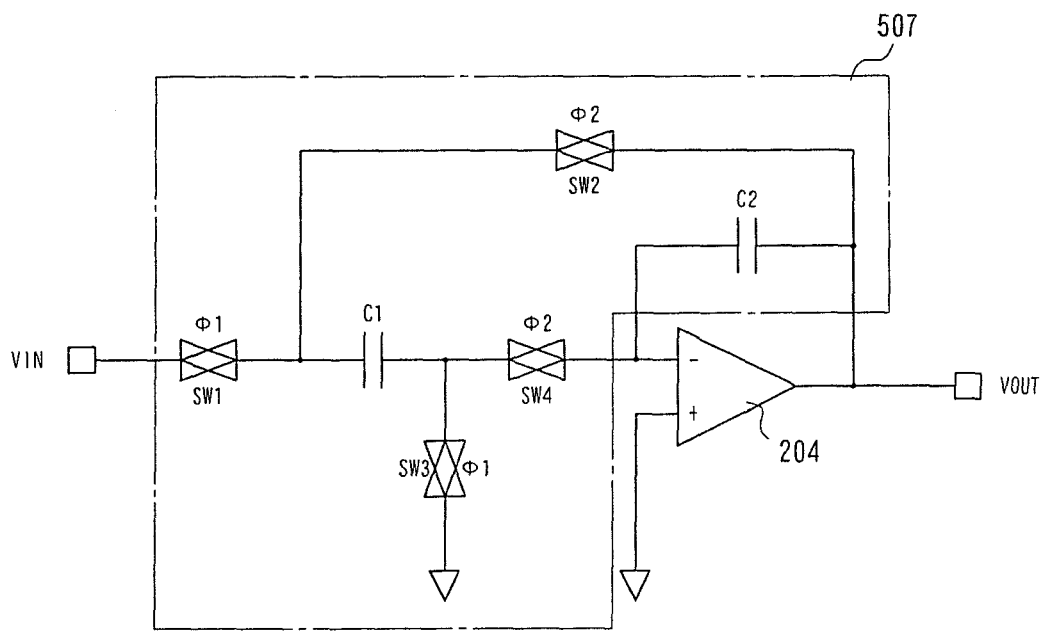
FIG. 14 is a diagram showing a structure of a unity gain sampling circuit according to one or more embodiments of the present invention.

As shown in FIG. 14, a unity gain sampling circuit 505 of one or more embodiments of the present invention comprises a switched capacitor circuit 507 and an operational amplifier 204.

The switched capacitor circuit 507 comprises switches SW1~SW4 and capacitors C1 and C2. The switch SW1 opens and closes a path between an input terminal of an input voltage VIN and a first terminal of the capacitor C1 according to a clock signal φ1. The switch SW2 opens and closes a path between a second terminal of the capacitor C1 and an inverting input terminal (−) of the operational amplifier 204 according to a clock signal φ2. The switch SW3 opens and closes a path between a second terminal of the capacitor C1 and a ground terminal according to the clock signal φ1. The switch SW4 opens and closes a path between the first terminal of the capacitor C1 and an output terminal of the operational amplifier 204 according to the clock signal φ2.

The inverting input terminal (−) of the operational amplifier 204 is connected to the output terminal of the operational amplifier 204 via the capacitor C2. In addition, a non-inverting input terminal (+) of the operational amplifier 204 is grounded.

Figure 15:
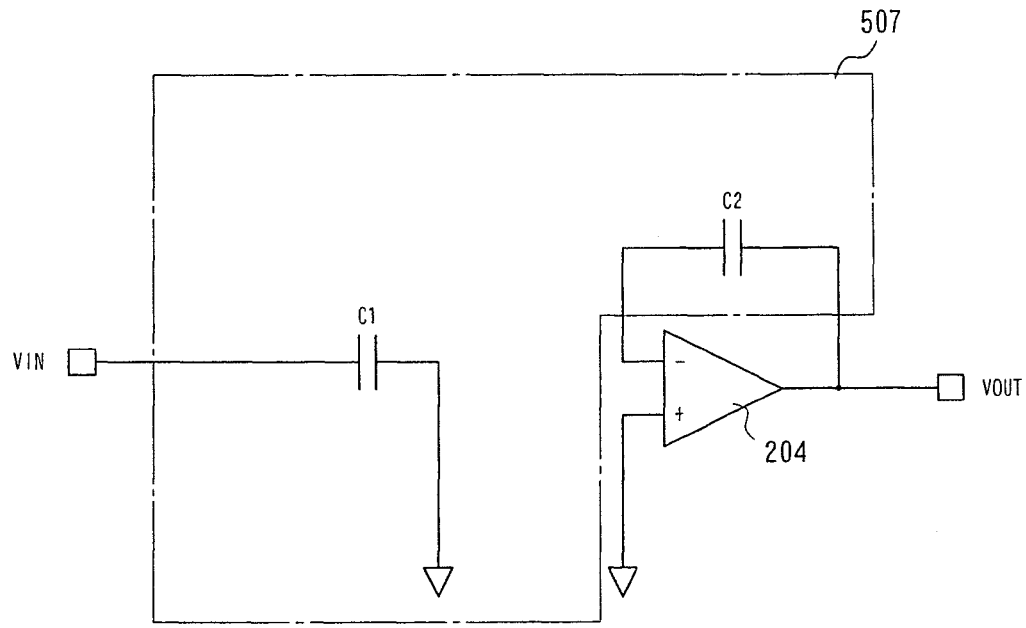
FIG. 15 is a diagram showing an operation of a unity gain sampling circuit according to one or more embodiments of the present invention.
Figure 16:
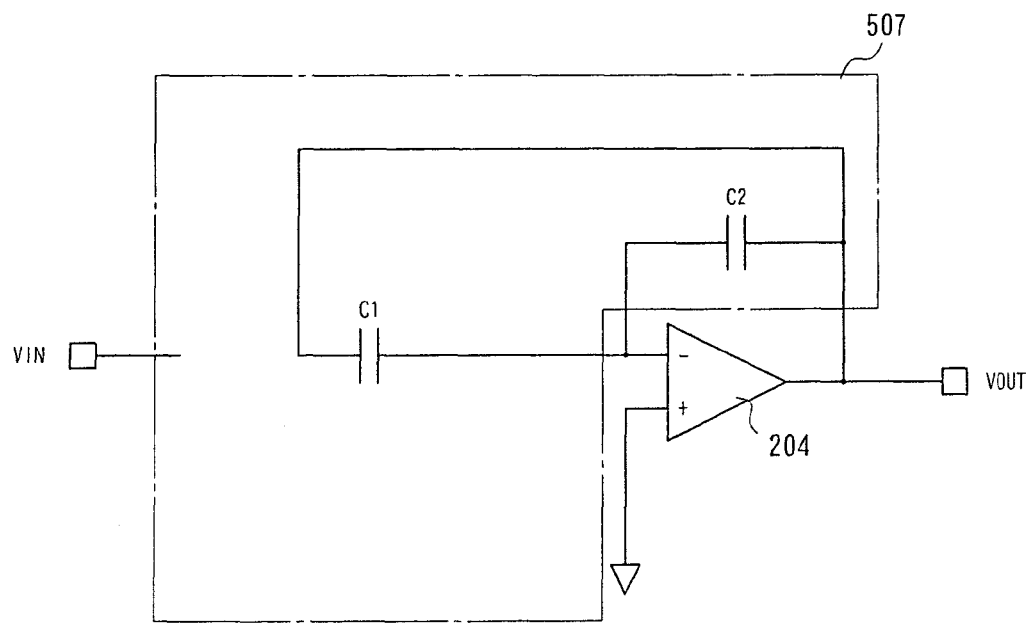
FIG. 16 is a diagram showing an operation of a unity gain sampling circuit according to one or more embodiments of the present invention.

In a sampling mode, the clock φ1 is set to the high level, to switch SW1 and SW3 ON, and the clock φ2 is set to the low level, to switch SW2 and SW4 OFF. With this process, the unity gain sampling circuit 505 is set in the sampling mode, as shown in FIG. 15. Then, the clock φ1 is set to the low level, to switch SW1 and SW3 OFF, and the clock φ2 is set to the high level, to switch SW2 ON. With this process, the unity gain sampling circuit 505 is set in a holding mode as shown in FIG. 16.

In the unity gain sampling circuit 505 of one or more embodiments of the present invention, the repetition of sampling and holding according to the operation timings of the clocks φ1 and φ2, the current flowing to the operational amplifier 204 is changed accordingly. In the one or more embodiments of the present invention, the current is set to a lower value in the sampling mode, and is set to the normal current value in the holding mode. Therefore, the power consumption of the overall circuit can be reduced without degrading the circuit performance.

<Delta-Sigma Modulation-Type Analog-to-Digital Converter>

Figure 17:
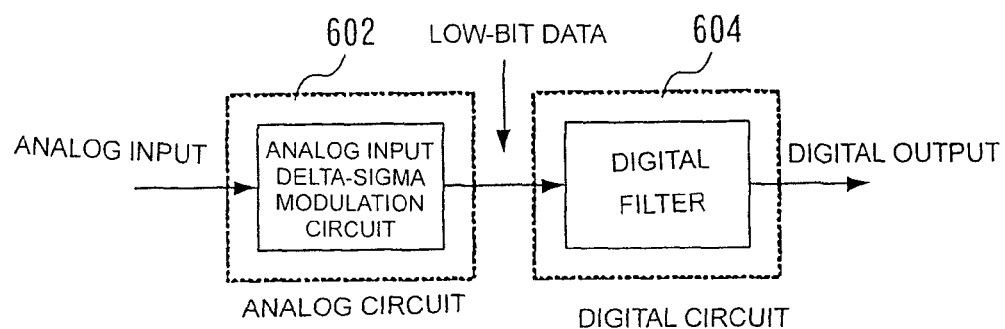
FIG. 17 is a diagram showing a structure of a delta-sigma modulation-type analog-to-digital converter according to one or more embodiments of the present invention.

As shown in FIG. 17, a delta-sigma modulation-type analog-to-digital converter 600 of one or more embodiments of the present invention comprises a delta-sigma modulation circuit (analog circuit) 602 which quantizes an analog signal, and a digital filter (digital circuit) 604 which processes quantized low-bit data and outputs a digital signal. With the use of two precision improvement techniques called "oversampling" in which sampling is executed at a frequency significantly higher than a signal frequency at the delta-sigma modulation circuit 602 which applies the analog process and "noise shaping" in which a frequency characteristic is given to the quantized noise (to push the quantized noise out of the signal band) to change the noise distribution, the quantized noise in the signal band is reduced. Then, the digital filter 604 at the later stage which applies a digital process removes the quantized noise outside of the signal band, to achieve high resolution A/D conversion.

Figure 18:
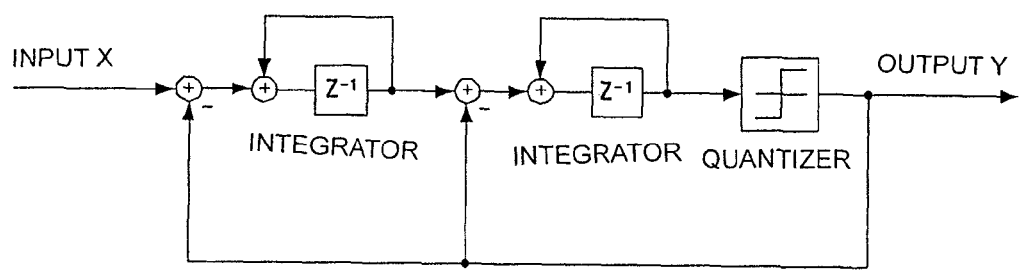
FIG. 18 is a diagram showing a structure of a delta-sigma modulation circuit according to one or more embodiments of the present invention.

As shown in FIG. 18, with regard to the delta-sigma modulation circuit 602, a delta-sigma modulation circuit to which the low-power-consumption switched capacitor circuit can be applied is not limited, and any system may be employed, regardless of the structure of a loop filter (feed-forward type, feedback type, or cascade type), transmission characteristic (low-pass type, or band-pass type), order of the filter, or the quantization level (single bit or multiple bit). In one or more embodiments of the present invention, as the structure of the delta-sigma modulation circuit 602, an example configuration is described in which a second-order decentralized feedback type structure which uses two switched capacitor circuits is employed, and the quantization level is 1 bit.

With regard to an input voltage X, a second-order integration action $(Z^{-1}/1-Z^{-1})^2$ of the forward path and the second-order differentiation action $(1-Z^{-1})^2$ by the feedback are implemented so that input voltage X=output voltage Y (delay operator $Z^{-1}$ is omitted). With regard to the quantized noise Q generated by the quantization, because only the second-order differentiation action by the feedback is implemented, that is, $(1-Z^{-1})^2 \times Q$, the transmission characteristic of the overall circuit is $Y=X+(1-Z^{-1})^2 \times Q$.

An operation principle will now be described. The input voltage X is input to a 1-bit quantizer through two integrators.

The quantizer judges the signal which is output from the second integrator as positive/negative, and outputs an output voltage Y of 1 bit. The binary value (1, 0) of the output voltage Y represents a full-scale value of positive/negative, and the output voltage Y is output to the digital filter at the later stage, and at the same time, is fed back through a 1-bit D/A converter to the input of the integrators as an inverted signal. The inverted signal is added to the input voltage of each integrator, and used as the input of the sampling signal at the next time.

Figure 19:
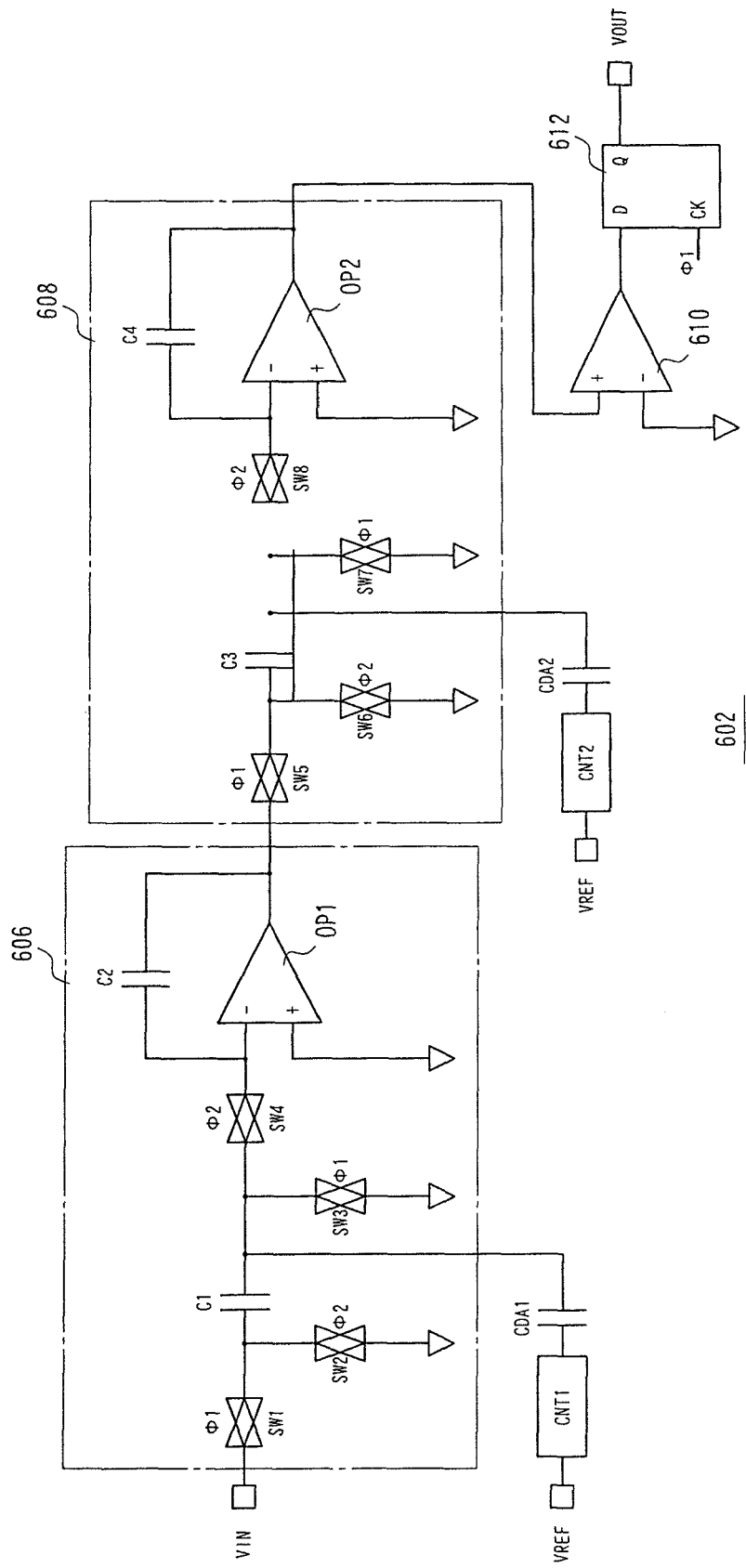
FIG. 19 is a diagram showing a structure of a delta-sigma modulation circuit according to one or more embodiments of the present invention.

As shown in FIG. 19, the delta-sigma modulation circuit 602 comprises positive phase integrating circuits 606 and 608, a comparator 610, and a flip-flop 612.

Each of the positive phase integrating circuits 606 and 608 has a structure similar to that of the positive phase integrating circuit 200 shown in FIG. 1, and comprises a switched capacitor circuit.

Figure 20:
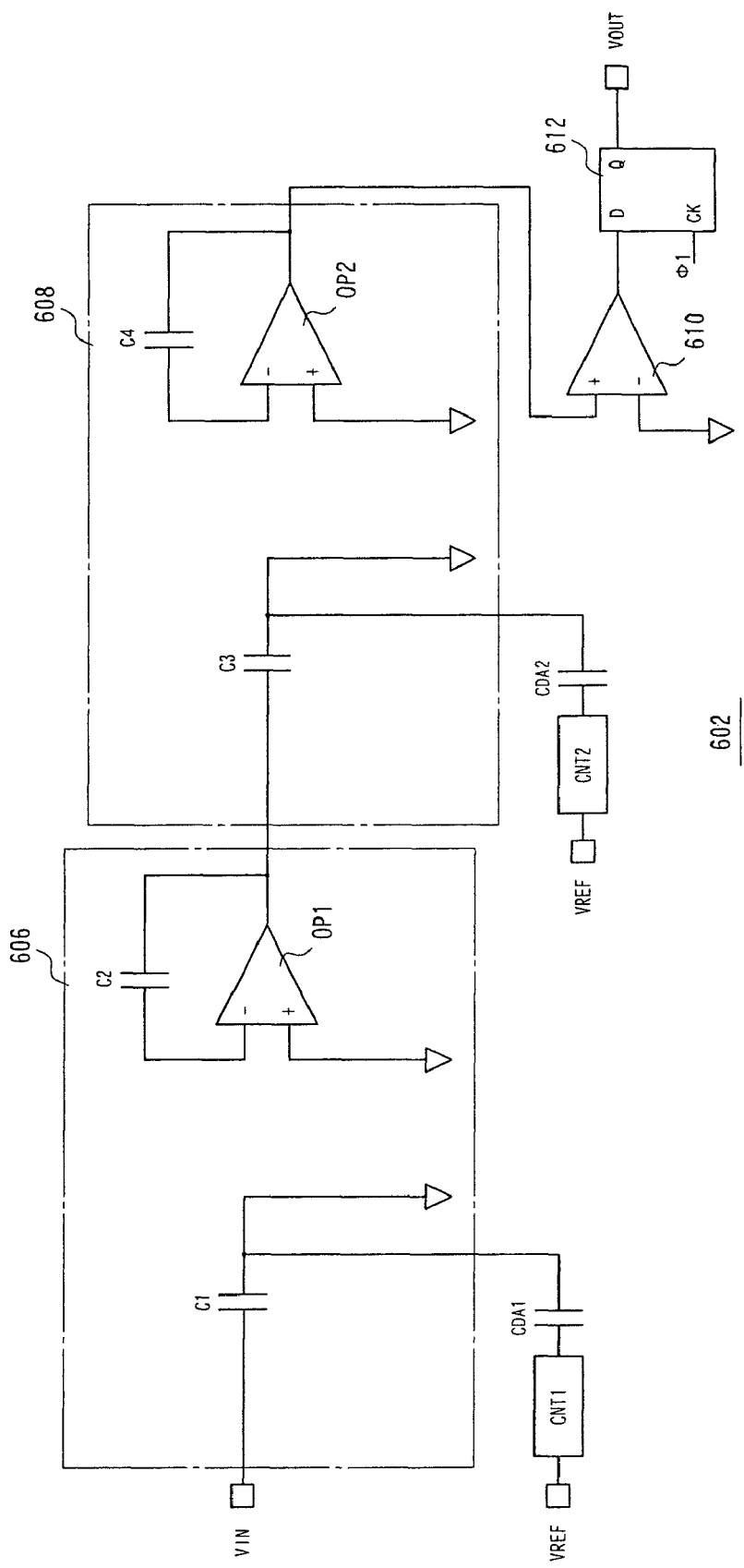
FIG. 20 is a diagram showing an operation of a delta-sigma modulation circuit according to one or more embodiments of the present invention.
Figure 21:
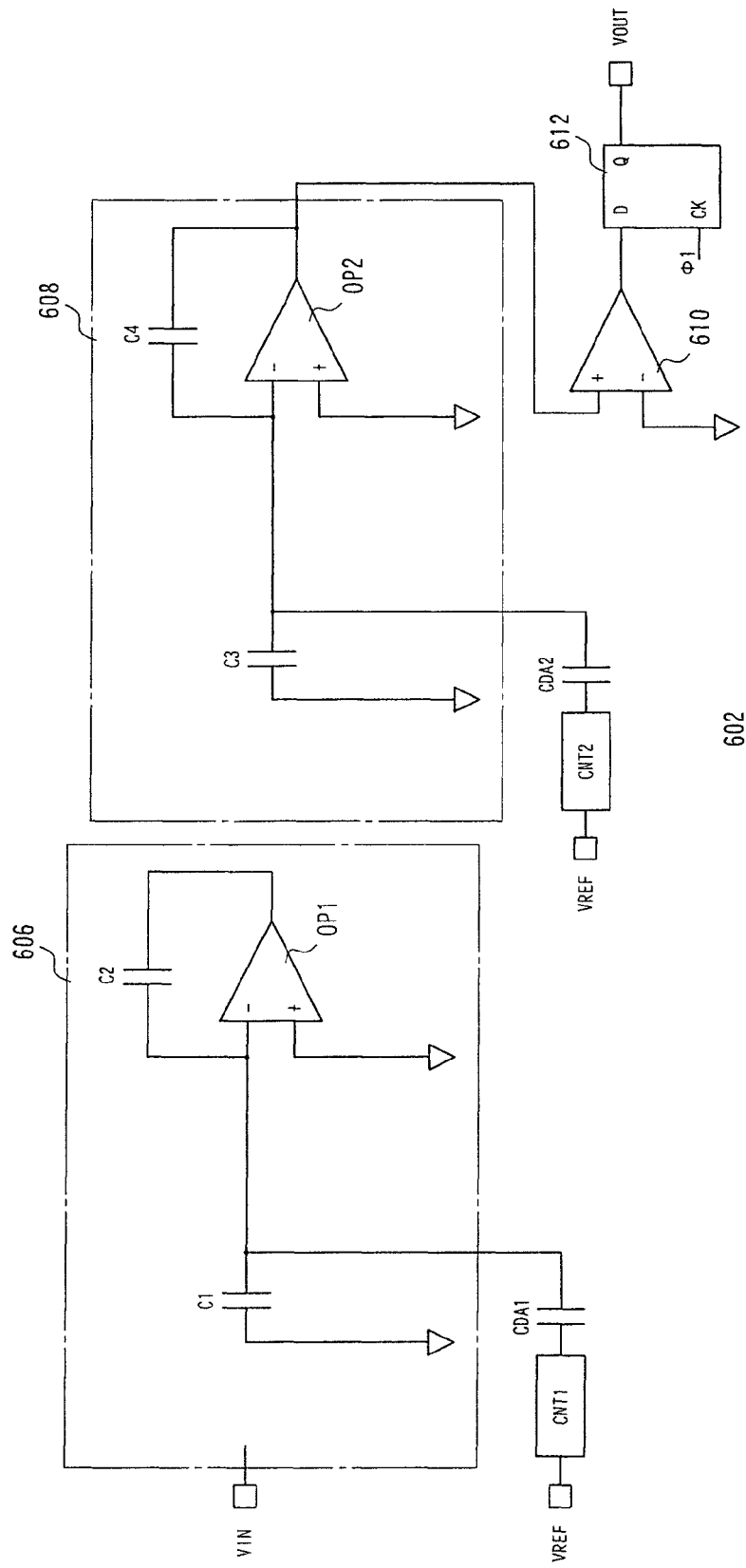
FIG. 21 is a diagram showing an operation of a delta-sigma modulation circuit according to one or more embodiments of the present invention.

The positive phase integrating circuit 606 has a structure to be controlled between a sampling mode and an integration mode by 4 switches (SW1~SW4). The positive phase integrating circuit 608 has a structure to be controlled between a sampling mode and an integration mode by 4 switches (SW5~SW8). As shown in the clock timing chart of FIG. 2, $\phi 1$ and $\phi 2$ are two-phase clocks which do not overlap each other. In the sampling mode, the clock $\phi 1$ is set to the high level, to switch SW1, SW3, SW5, and SW7 ON, and the clock $\phi 2$ is set to the low level, to switch SW2, SW4, SW6, and SW8 OFF. With this process, the positive phase integrating circuits 606 and 608 are set in a sampling state in which the respective input voltage is sampled by the respective one of the capacitors C1 and C3, as shown in FIG. 20. Then, the clock ($\phi 1$ is set to the low level, to switch SW1, SW3, SW5, and SW7 OFF, and the clock $\phi 2$ is set to the high level, to switch SW2, SW4, SW6 and SW8 ON. With this process, the positive phase integrating circuits 606 and 608 are set in an integration mode in which the respective voltage sampled in the respective one of the capacitors C1 and C3 is integrated, as shown in FIG. 21.

The comparator 610 receives an output signal from the positive phase integrating circuit 608 at a non-inverting input terminal (+), and outputs a signal corresponding to a difference with a voltage applied to the inverting input terminal (−). The flip-flop 612 receives an output signal from the comparator 610, holds the output signal from the comparator 610 in synchronization with the timing when the clock $\phi 1$ changes from the low level to the high level, and outputs the held value.

Here, because the positive phase integrating circuits 606 and 608 repeat sampling and integrating according to the operation timings of the clocks $\phi 1$ and $\phi 2$, the current flowing in the operational amplifiers included in the positive phase integrating circuits 606 and 608 can be changed accordingly. In the positive phase integrating circuits 606 and 608, the current is switched between the high/low periods of the clocks $\phi 1$ and $\phi 2$. More specifically, in the sampling mode, the supplied currents to the operational amplifiers of the positive phase integrating circuits 606 and 608 are set to lower values, and in the integration mode, the supplied currents to the operational amplifiers of the positive phase integrating circuits 606 and 608 are returned to normal. With this configuration, the power consumption of the overall circuit can be reduced without degrading the circuit performance.

In particular, when a plurality of positive phase integrating circuits 606 and 608 are provided such as in the delta-sigma modulation-type analog-to-digital converter 600 in one or more embodiments of the present invention, the power consumption can further be reduced.

In this description, an example configuration of the delta-sigma modulation-type analog-to-digital converter 600 having a plurality of positive phase integrating circuits 606 and 608 is described. Alternatively, the advantage of the reduction in power consumption can be enlarged when a plurality of circuits having the switched capacitor circuit are provided, such as the positive phase integrating circuit, the negative phase integrating circuit, the non-inverting amplifier, the sample and hold circuit, the unity gain sampling circuit, etc.

In the circuits of one or more embodiments of the present invention, 4-phase clocks which can independently control the switches may be used in place of the two-phase clocks, to improve the performance of the integrator by setting suitable timings. In this case also, the power consumption can be reduced by switching the supplied current to the element included in the circuit according to the switching of the clocks.

<Current Limiting Circuit>

In a circuit of one or more embodiments of the present invention, a current limiting circuit which switches the current flowing to the element according to the switching of high/low levels of the clocks $\phi 1$ and $\phi 2$ is required. The current limiting circuit will now be described.

Figure 22:
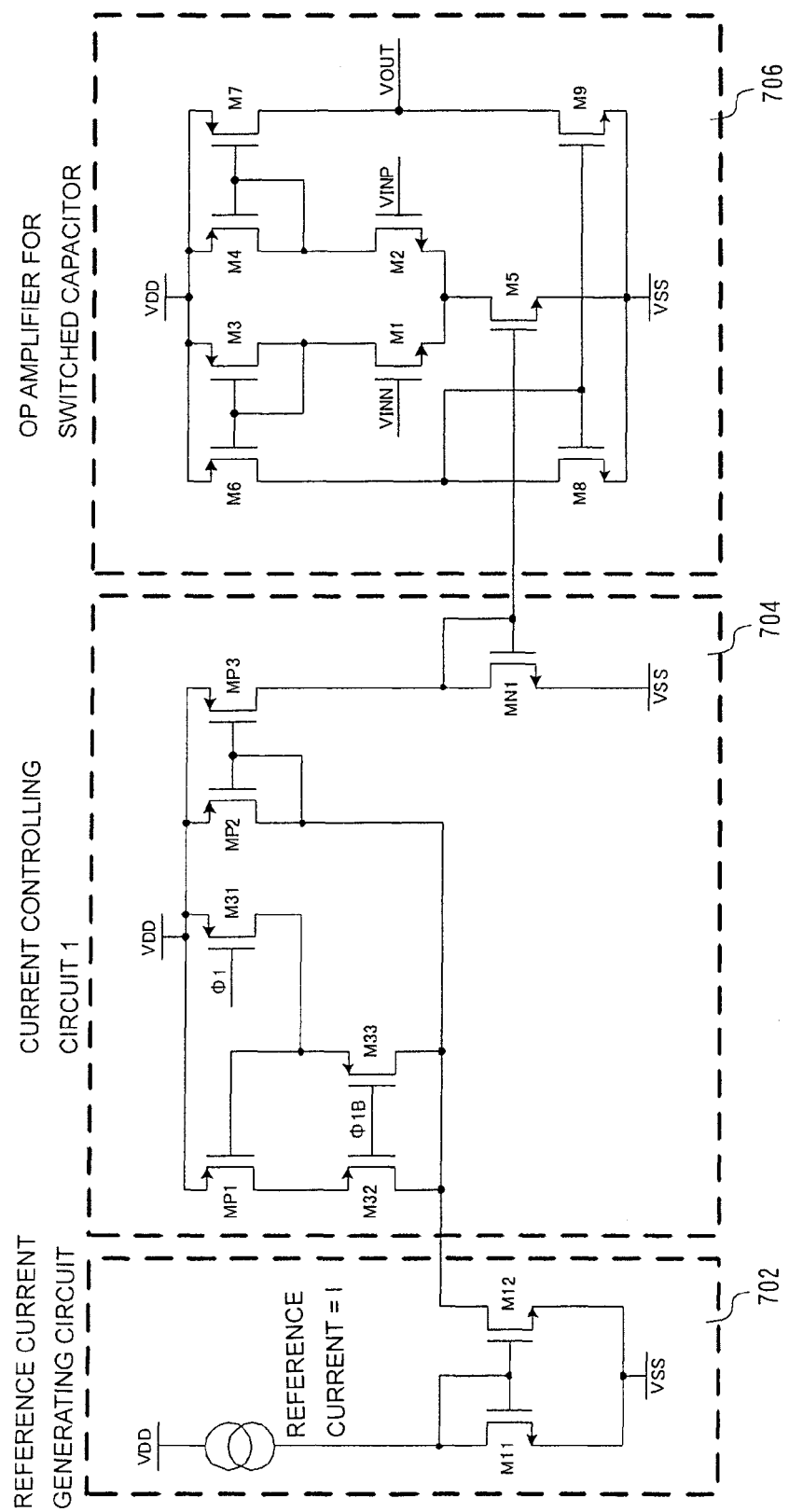
FIG. 22 is a diagram showing a structure of a current limiting circuit according to one or more embodiments of the present invention.

As shown in FIG. 22, a current limiting circuit 700 comprises a reference current generating circuit 702, a current controlling circuit 704, and an operational amplifier 706. The reference current generating circuit 702 generates a reference current supplied to the current controlling circuit 704. The current controlling circuit 704 has a function to switch-control the reference current generated by the reference current generating circuit 702 according to the clock $\phi 1$, and to switch the supplied current to the operational amplifier 706. The current limiting circuit 700 shown in FIG. 22 has a structure in which the current is controlled by P-channel transistors. The operational amplifier 706 is an element in which the current is limited by a clock of the switched capacitor circuit. The current flowing in the operational amplifier 706 is increased or decreased according to the supplied current from the current controlling circuit 704.

For example, the reference current generated in the reference current generating circuit 702 is I, and a current mirror ratio of N-channel transistors M11 and M12 is set to M11:M12=1:1. P-channel transistors M31, M32, and M33 included in the current controlling circuit 704 function as switches controlled by the clock $\phi 1$. The P-channel transistors M31, M32, and M33 are switched OFF when the clock $\phi 1$ is at the high level and are switched ON when the clock $\phi 1$ is at the low level. A clock $\phi 1B$ is a clock signal having an opposite phase to the clock $\phi 1$. In addition, P-channel transistors MP1, MP2, and MP3 have the same transistor size and the same multiple number. A current mirror ratio between an N-channel transistor MN1 included in the current controlling circuit 704 and an N-channel transistor M5 included in the operational amplifier 706 is set at MN1:M5=1:2. P-channel transistors M3 and M4 included in the operational amplifier have the same transistor size and the same multiple number. Current mirror ratios of P-channel transistors M3 and M6 and M4 and M7 are set such that M3:M6=M4:M7=1:1. In addition, a current mirror ratio of N-channel transistors M8 and M9 is set at M8:M9=1:1. In such a circuit structure, the reference current I generated by the reference current generating circuit 702 is supplied to the current controlling circuit 704.

When the clock $\phi 1$ is at the high level, the P-channel transistor M31 included in the current controlling circuit 704 is set at the OFF state, the P-channel transistors M32 and M33 are set in the ON state, and the P-channel transistor MP1 is set in a diode connection state. In this case, the gates and drains of the P-channel transistors MP1 and MP2 are short-circuited, and the current I flows the P-channel transistors MP1 and MP2. This state is equivalent to a structure where the P-channel transistors MP1 and MP2 and the P-channel transistor MP3 form a current mirror circuit. A current mirror ratio is 2:1, and a current of 0.5I flows in the P-channel transistor MP3. Because the current mirror ratio between the N-channel transistor MN1 and the N-channel transistor M5 of the operational amplifier 706 is 1:2, a current of I flows in the transistor M5. Because the current mirror ratios of the P-channel transistors M3 and M6 and the P-channel transistors M4 and M7 are 1:1, a total current of 2I flows in the operational amplifier 706.

When the clock φ1 is at the low level, the P-channel transistor M31 included in the current controlling circuit 704 is set in the ON state, the P-channel transistors M32 and M33 are set in the OFF state, and the P-channel transistor MP1 is set in the OFF state, and thus no current flows. In this case, a current of I flows in the P-channel transistor MP2. Because the current mirror ratio of the P-channel transistors MP2 and MP3 is 1:1, a current of I flows in the P-channel transistor MP3. Because the current mirror ratio of the N-channel transistor MN1 and the N-channel transistor M5 in the operational amplifier 706 is 1:2, a current of 2I flows in the transistor M5. Because the current mirror ratios of the P-channel transistors M3 and M6 and the P-channel transistors M4 and M7 are 1:1, a total current of 4I flows in the operational amplifier.

Figure 24:
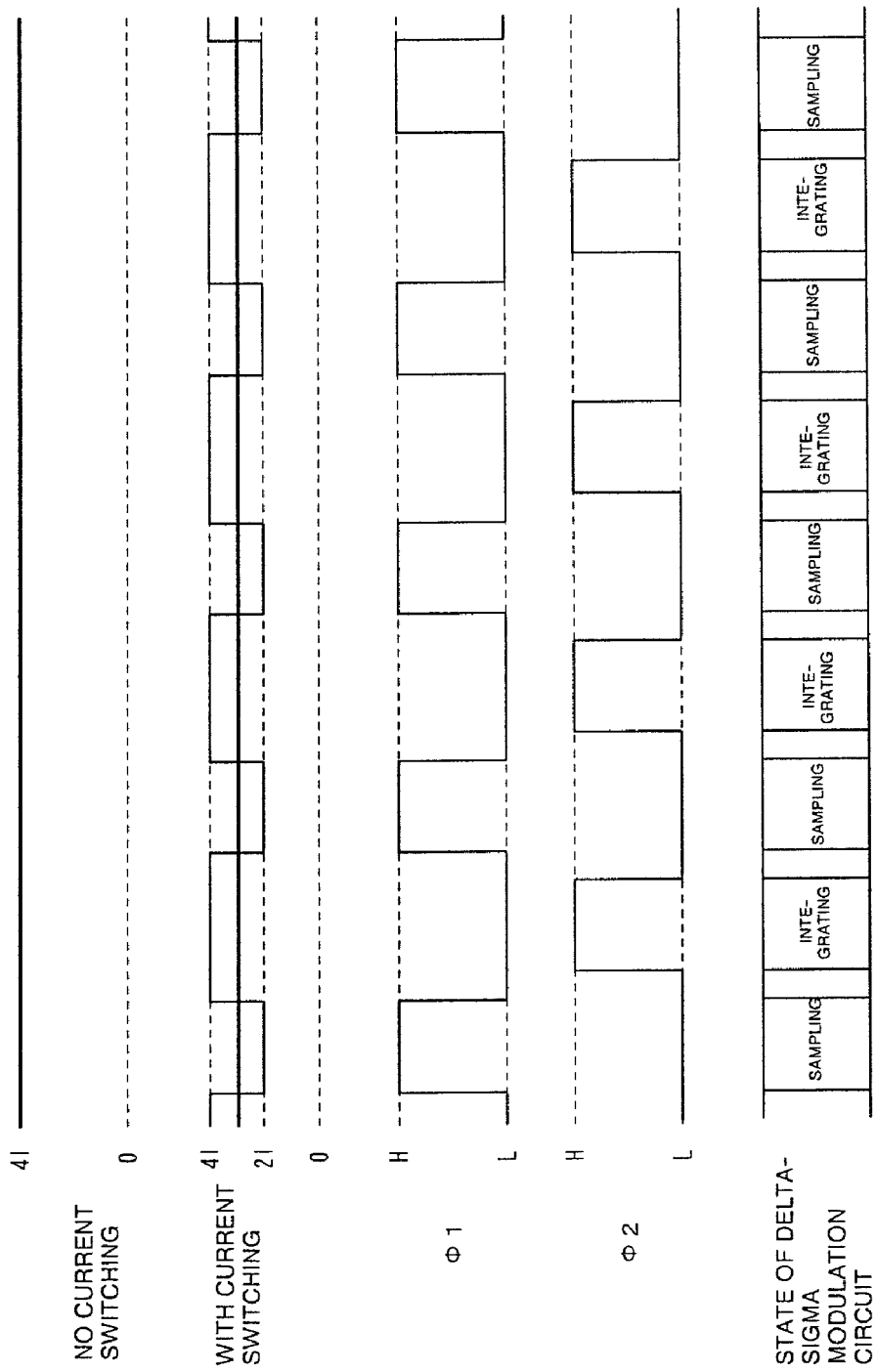
FIG. 24 is a timing chart showing an operation of a current limiting circuit according to one or more embodiments of the present invention.
Figure 25:
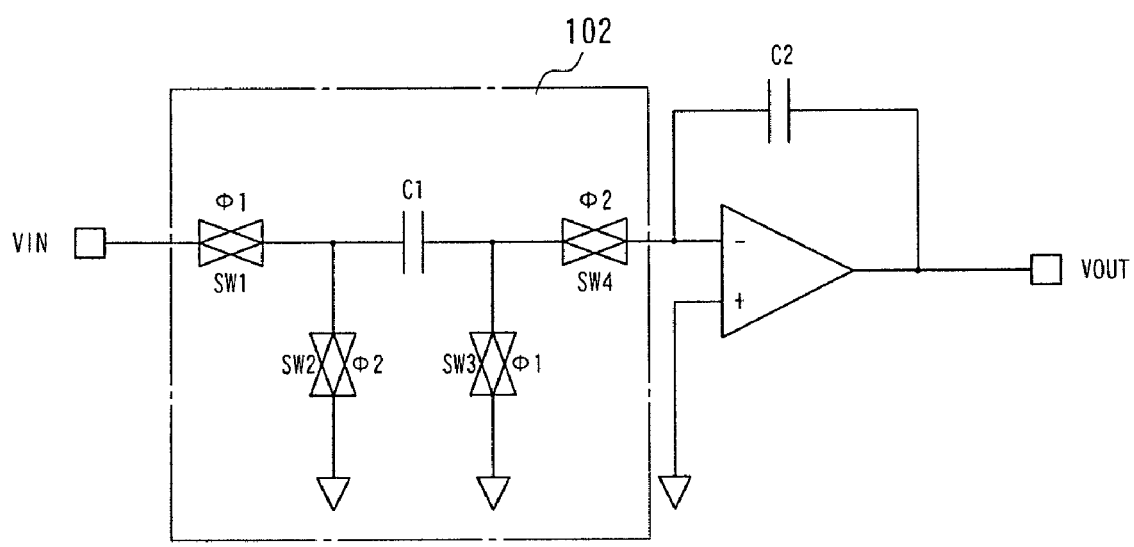
FIG. 25 is a diagram showing a structure of a positive phase integrating circuit in related art.

With such control, as shown in FIG. 24, the total current flowing in the operational amplifier 706 changes according to the operation of the clock φ1, and if the current 4I in the operational amplifier 706 which is set when the clock φ1 is at the low level is taken as a reference, the total current flowing in the operational amplifier 706 when the clock φ1 is at the high level is 2I. By synchronizing the clock φ1 used in the current controlling circuit 704 to the clock timing of the delta-sigma modulation circuit 602, to apply control to supply a lower amount of current in the sampling mode and a larger amount of current in the integrating mode, it is possible to reduce the power consumption without degrading the system performance.

Figure 23:
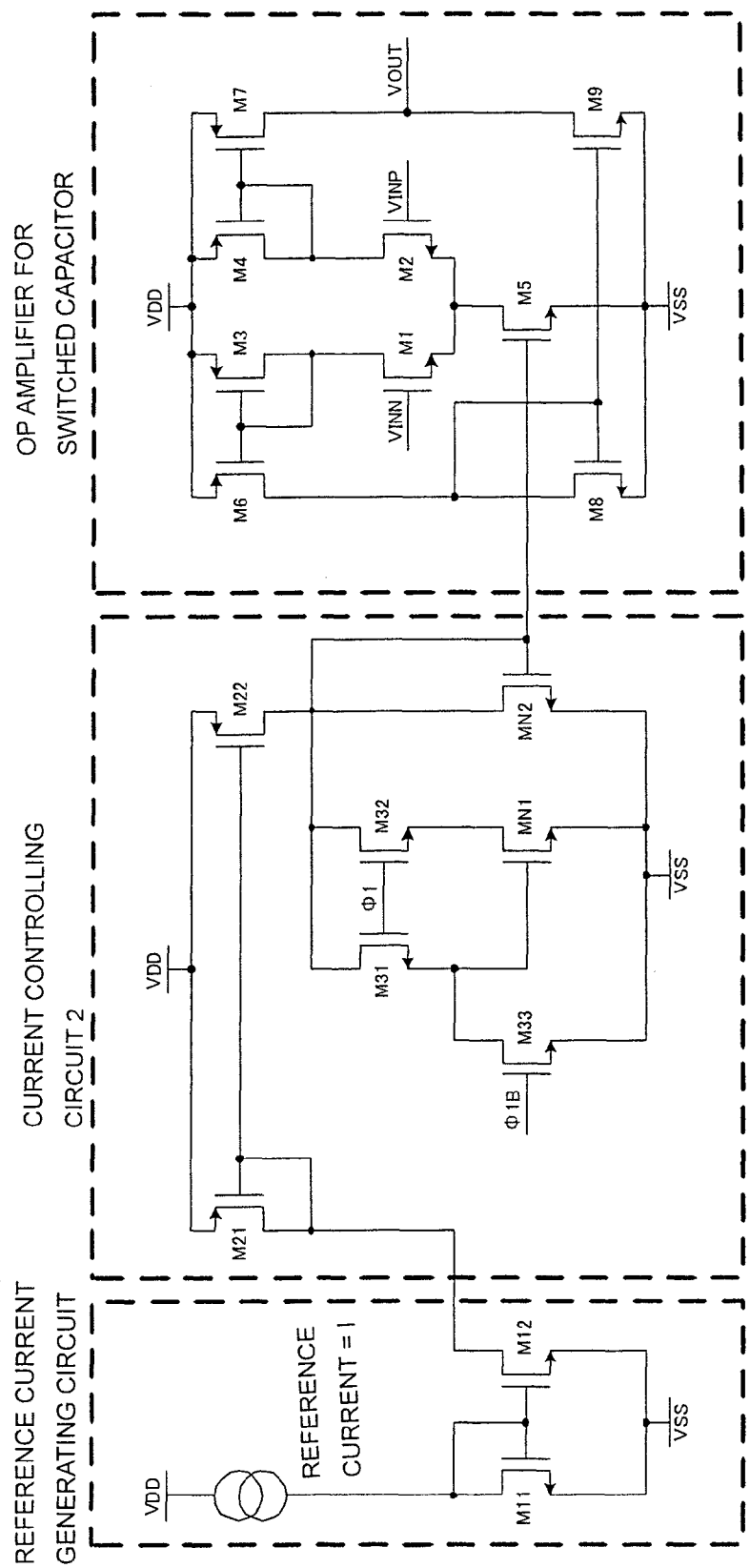
FIG. 23 is a diagram showing a structure of a current limiting circuit according to one or more embodiments of the present invention.

FIG. 23 shows an example configuration of the current controlling circuit 708 which controls current with N-channel transistors. Similar to the current controlling circuit 704 shown in FIG. 22 which controls current with the P-channel transistors, the current controlling circuit 708 can control the current consumption of the operational amplifier according to the switching of the high/low levels of the clock φ1.

Moreover, a structure of the operational amplifier in which the N-channel transistor input type is replaced with a P-channel transistor input type is also possible, and the circuit topology and the current mirror ratio may be changed. The ratio of the current to be switched may also be arbitrarily set according to the circuit structure. When a system is constructed using a plurality of switched capacitor circuits, the current consumption of the operational amplifiers may be controlled with one current controlling circuit or current controlling circuits may be provided independently for each switched capacitor circuit. In addition, one or more embodiments of the present invention can be applied to a system structure in which different types of switched capacitor circuits are combined. Moreover, the switched capacitor circuit and the operational amplifier may be of a single-end type or of a fully differential type.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A switched capacitor circuit, comprising:
    a capacitor;
    an element which receives an output of the capacitor;
    a first switching element which is provided on an input side of the capacitor, and is turned on when a first clock signal is in a high period and is turned off when the first clock signal is in a low period;
    a second switching element which is provided on an output side of the capacitor, and is turned on when a second clock signal having a high period which does not overlap the high period of the first clock signal is in a high period and is turned off when the second clock signal is in a low period; and
    a current controlling circuit comprising a current mirror circuit and which switches a current value of a current supplied to the element by switching a current mirror ratio so as to supply a first current to the element when the first switching element is turned on, and supply a second current which is different from the first current to the element when the second switching element is turned on.

2. The switched capacitor circuit according to claim 1, wherein the element is an operational amplifier.

* * * * *